United States Patent [19]
Klose et al.

[11] Patent Number: 5,700,702
[45] Date of Patent: Dec. 23, 1997

[54] METHOD FOR MANUFACTURING AN ACCELERATION SENSOR

[75] Inventors: Helmut Klose, München; Markus Biebl, Augsburg; Thomas Scheiter; Christofer Hierold, both of München, all of Germany

[73] Assignee: Siemens Aktiengesellschaft, Munich, Germany

[21] Appl. No.: 676,282

[22] PCT Filed: Jan. 10, 1995

[86] PCT No.: PCT/DE95/00022

§ 371 Date: Jul. 17, 1996

§ 102(e) Date: Jul. 17, 1996

[87] PCT Pub. No.: WO95/19572

PCT Pub. Date: Jul. 20, 1995

[30] Foreign Application Priority Data

Jan. 18, 1994 [DE] Germany ................. 44 01 304.3

[51] Int. Cl.$^6$ ................................................. H01L 21/265
[52] U.S. Cl. ........................ 437/34; 437/3; 437/51; 437/901; 437/974; 148/DIG. 159
[58] Field of Search ..................... 437/34, 51, 3, 437/901, 974; 148/DIG. 159

[56] References Cited

U.S. PATENT DOCUMENTS 4,918,032  4/1990  Jain et al. .
5,241,864  9/1993  Addie et al. .

FOREIGN PATENT DOCUMENTS

WO 87/07729  12/1987  WIPO .

OTHER PUBLICATIONS

Thin Solid Films, vol. 220, No. 1/2, Nov. 20, 1992, Properties of Polysilicon Films Annealed by a Rapid Thermal Annealing Process, Ristic et al, pp. 106–110.

IEEE Transactions On Electron Devices, vol. 29, No. 1, Jan. 1992, Micromechanical Accelerometer Integrated with MOS Detection Circuitry, Petersen et al, pp. 23–27.

IEEE International Symposium on Circuits and Systems, vol. 4, No. 1, May 1990, Integrated GaAs Microsensors, Polla et al, pp. 3085–3088.

*Primary Examiner*—Tuan H. Nguyen
*Attorney, Agent, or Firm*—Hill, Steadman & Simpson

[57] ABSTRACT

Manufacturing method for an acceleration sensor on silicon, whereby, following the manufacture of the doped regions required for the electronic function elements, a polysilicon layer is deposited. The polysilicon layer is structured such that a portion of this polysilicon layer forms an electrode (for example, the emitter electrode (9) and the collector electrode (10) of a transistor) and a sensor layer (17) provided as sensor element.

9 Claims, 5 Drawing Sheets

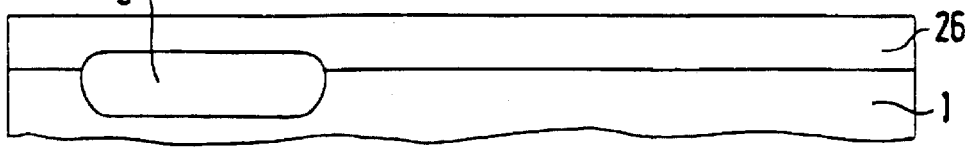
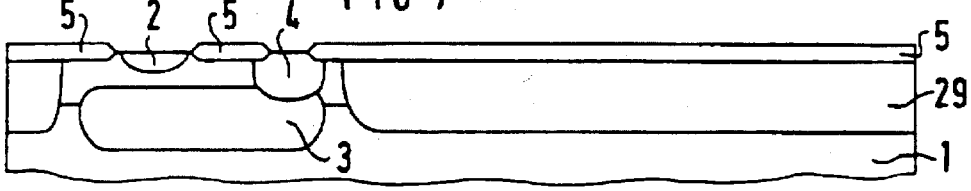
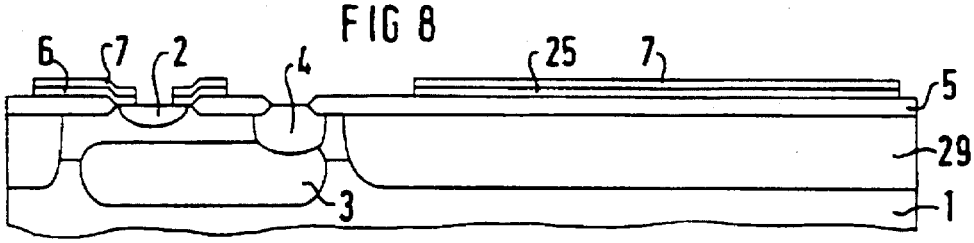
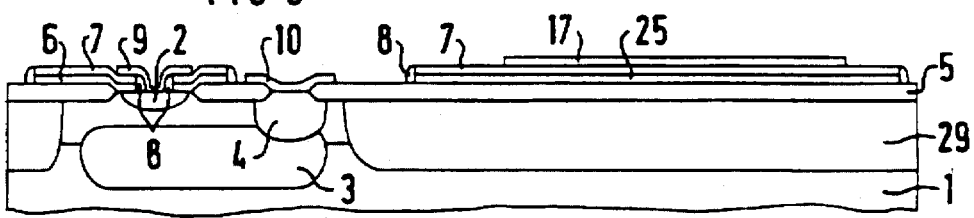

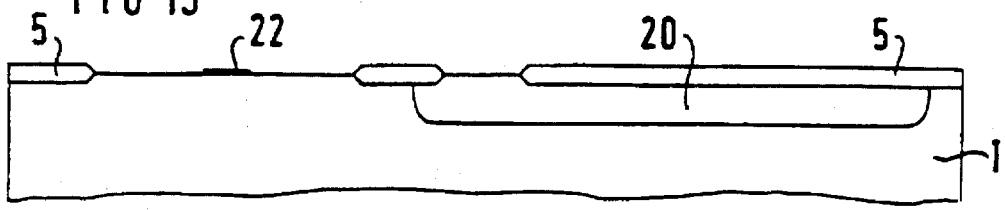
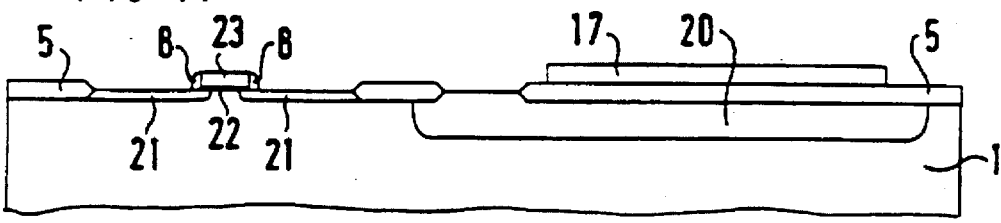
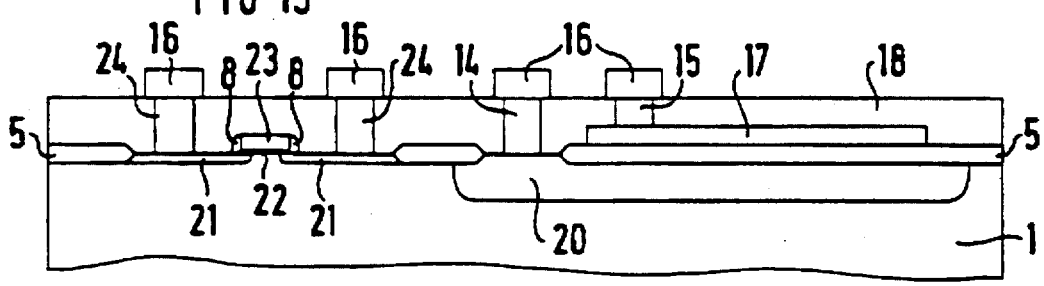

5,700,702

METHOD FOR MANUFACTURING AN ACCELERATION SENSOR

BACKGROUND OF THE INVENTION

The present invention is directed to a manufacturing method for acceleration sensors in silicon technology wherein micromechanical manufacturing method are applied.

Extremely small and, thus, cost-efficient micromechanical acceleration sensors for acceleration measurements in the region of earth's accelerations require electronic circuits for the interpretation of the measured result. Such intelligent sensors are usually manufactured in hybrid technology because a realization in the same substrate requires a practically additive manufacturing technology. The electronic circuit and the micromechanical sensor are successively manufactured, so that such integrated sensors usually require more than four auxiliary masks in the manufacture, this causing an added outlay of at least 20%.

SUMMARY OF THE INVENTION

An object of the present invention is to specify a beneficial manufacturing method for a micromechanical acceleration sensor with electronics.

In general terms the present invention is a method for manufacturing an acceleration sensor on silicon. In a first step, a structure of doped regions for the fashioning of a transistor is produced proceeding on the basis of a substrate layer of silicon. In a second step, a polysilicon layer is deposited and structured such that this polysilicon layer forms at least one electrode of this transistor and a sensor layer. In a third step, metallizations are applied as electrical terminals for this transistor, for this sensor layer and for at least one further sensor electrode. In a fourth step, this sensor layer is uncovered to such an extent that it is at least partially movable in at least one direction.

Advantageous developments of the present invention are as follows.

The transistor is manufactured as a CMOS transistor, and the polysilicon layer forms the gate electrode and the sensor layer.

The transistor is manufactured as a bipolar transistor. A further polysilicon layer is deposited and structured between the first and the second step such that this further polysilicon layer forms the base electrode and a lower sensor electrode. An insulator layer and spacers are then applied. The polysilicon layer applied in the second step forms the emitter electrode, the collector electrode and the sensor layer.

For CMOS transistor manufacture, in the first step, a doped region (CMOS well) provided for the transistor is produced in the substrate layer and a structured oxide layer is produced on the surface of the substrate layer. The source and drain regions and the gate oxide are then produced in openings of this oxide layer. In the second step, the sensor layer is produced on a portion of this oxide layer. In the third step, a dielectric layer is applied, via holes are produced therein, and the source and drain metallizations and the metallizations for the sensor layer and for a further sensor electrode are introduced into these via holes. In the fourth step, this dielectric layer and this oxide layer are removed to an extent required for the provided mobility of the sensor layer.

For bipolar transistor manufacture, in the first step, an implantation is undertaken for the manufacture of a collector region and a doped epitaxial layer is applied. A structured oxide layer is then produced. A base region doped opposite this epitaxial layer and a collector terminal region are produced through openings of this oxide layer. The further polysilicon layer and an insulator layer thereon are applied and structured, so that the lower sensor electrode is arranged on this oxide layer. The free edges of the base electrode are then insulated by spacers. The second step is then implemented.

The sensor layer is manufactured as a self-supporting polysilicon strip (cantilever) in the fourth step. The sensor layer is manufactured as a mass part suspended at springs in the fourth step. The further sensor electrode and the sensor layer are coplanarly arranged and are arranged vertically above one another with reference to the layer planes. Following the third step, a planar, upper sensor electrode is produced coplanarly and vertically above the sensor layer with reference to the layer planes.

The technology of manufacturing micromechanical structures in silicon is applied in the inventive manufacturing method. The electronic circuits are manufactured in silicon technology, particularly in bipolar technology or CMOS technology in silicon. The inventive manufacturing method can be combined with all manufacturing methods of electronic components in silicon wherein one or two polysilicon layers are applied. Sensors can be manufactured wherein the sensor element is formed by a silicon part that is at least partially movable in at least one direction. In particular, the inventive method can be applied for manufacturing acceleration sensors with a self-supporting polysilicon strip (cantilever sensor types). The simplification in the manufacture results therefrom that at least one polysilicon layer for a transistor and the sensor element is deposited in common and structured. At least one transistor electrode and a spatially limited sensor layer as movable sensor element are produced from this polysilicon layer. Given application of a double polysilicon process, a further polysilicon layer can also be previously applied, this, when structured, forming a further transistor electrode and a cooperating electrode provided for the acceleration measurement.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

FIGS. 6 through 11 show sensors in cross section after various steps of the method leading to the structure shown in FIG. 1.

FIGS. 13 through 15 show an acceleration sensor in cross section after various steps in the manufacture of one of the structures shown in FIGS. 3 or 4.

DESCRIPTION OF THE PREFERRED EMBODIMENTS

Figure 3:
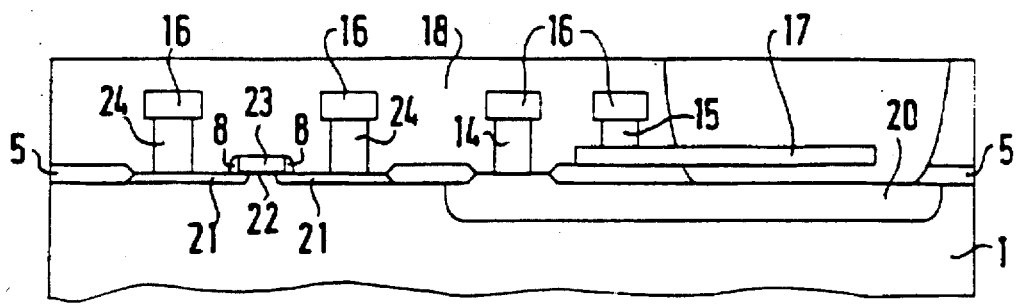
Figure 4:
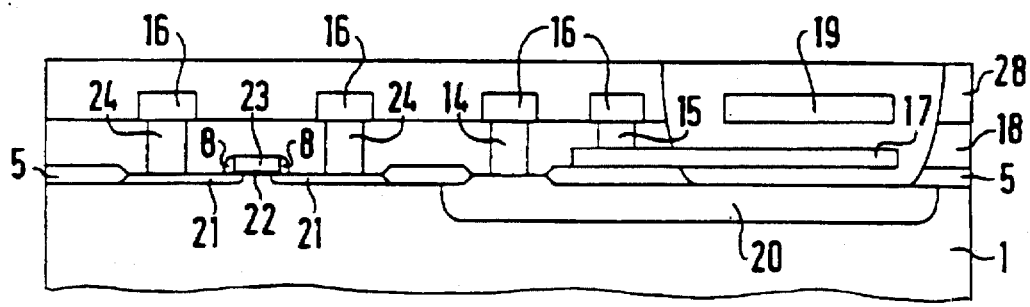

A single polysilicon process for manufacturing the acceleration sensor shall be described first. In such a process, only one polysilicon layer, from which a transistor electrode and the movable sensor layer are structured, is deposited. For example, the sensors illustrated in FIGS. 3 and 4 can be manufactured in this way. In FIG. 3, a CMOS transistor is manufactured on a substrate layer 1 of silicon. The source and drain regions 21 flank the channel region provided with the gate oxide 22. The gate electrode 23 of polysilicon limited by spacers 8 is located on the gate oxide 22. The sensor layer 17, which forms a self-bearing, anchored strip as cantilever, is likewise polysilicon. This strip is deflected given acceleration in a direction vertical relative to the layer plane. A cooperating electrode is required for the measurement, this being arranged under this sensor layer 17 as further sensor electrode 20. Metallizations 14,15 are present for this further sensor electrode 20 and the sensor layer 17. Source and drain metallizations 24 as well as terminal metallizations 16 are also present as interconnects. The structured oxide layer 5 functions as insulation of the various doped regions. In the exemplary embodiment of FIG. 4, an upper sensor electrode 19 is additionally provided, this being anchored between a dielectric layer 18 and a passivation layer 28 in the perpendicular to the plane of the drawing.

The embodiment of the manufacturing method possible for this acceleration sensor is based on a substrate layer 1 of silicon. This can either be a substrate or a silicon layer on a substrate. It can also be the silicon layer of an SOI substrate. The doped regions (CMOS wells) required for a CMOS transistor are produced by implantation. An additional, highly doped layer that serves later as cooperating electrode (further sensor electrode) for the sensor can be potentially introduced upon employment of the adjustment marks produced therefor. This additional doping is only needed in that case wherein the feed resistance of the CMOS n-well is not low enough in order to be able to implement an adequately exact measurement of the capacitance for the evaluation of the acceleration. The upper side of the substrate layer 1 can be converted into an oxide layer 5, for example by structured oxidation, this oxide layer 5 comprising openings at the places provided for the transistor and the connection of the further sensor electrode 20. The structure shown in FIG. 13 is realized after the application of the gate oxide 22. A polysilicon layer that is critical for the inventive method is then applied surface-wide. After the structuring of this layer, the gate electrode 23 and the sensor layer 17 provided for the movable sensor element remain therefrom. This sensor layer is located completely on the oxide layer 5 and is therefore separated from the remaining silicon. Upon employment of spacers 8 manufactured in the usual way, the source and drain regions 21 for the transistor are produced, so that the structure of FIG. 14 derives.

A dielectric layer 18 is applied in planarizing fashion, via holes being produced therein at the places provided for the contacting. These via holes can, for example, be filled with metal (for example, tungsten) before the first metallization level is applied. However, the via holes can also be filled together with the application of this terminal metallization 16, so that the source and drain regions 21 are provided with source and drain metallizations 24, and the further sensor electrode 20 provided as cooperating electrode is contacted with an appertaining metallization 14 and the sensor layer 17 is contacted with an appertaining metallization 15. The structure shown in FIG. 15 is then covered with a passivation that is then removed in the region of the sensor together with the dielectric layer 18 and the oxide layer 5 to such an extent that the part of the sensor layer 17 provided as cantilever is uncovered.

An upper sensor electrode 19 can also be applied onto the dielectric layer 18 together with the terminal metallizations (see FIG. 15). This upper sensor electrode 19 is dimensioned such that, after the removal of the dielectric layer 18 in the region of the sensor, the sensor layer 17 is freely movable between the upper sensor electrode and the further sensor electrode 20 and the upper sensor electrode 19 is laterally anchored on the dielectric layer 18, i.e. in a direction perpendicular to the plane of the drawing in the exemplary embodiment. A both-sided capacitative measurement between the sensor layer 17 and a respective cooperating electrode is then possible given the sensor.

Figure 1:
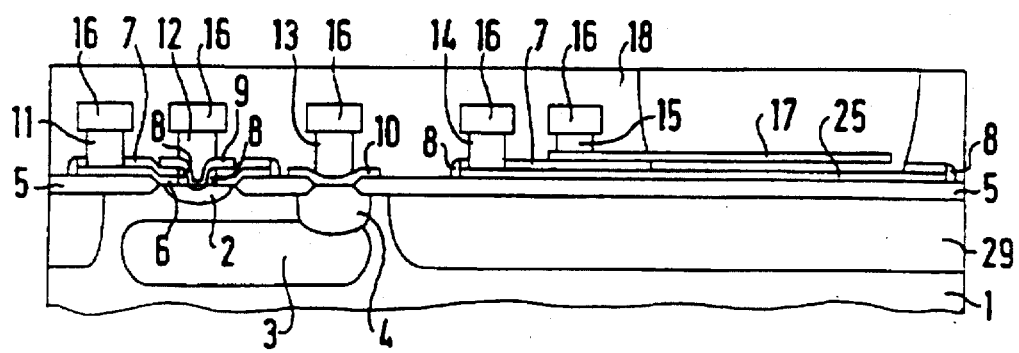
FIGS. 1 through 4 show exemplary embodiments of inventively manufactured sensors in cross section.

A bipolar transistor is integrated in the substrate layer 1 given the sensor of FIG. 1. A doped base region 2 and an oppositely doped collector region 3 are fashioned in the substrate layer 1, for example by implantation. The buried collector region 3 has a collector terminal region 4 with the same operational sign of the doping conductively connected to the surface of the substrate layer. The surface of the substrate layer 1 is insulated with a structured oxide layer 5. Extending to the base region 2, the base electrode 6 is located on this oxide layer 5 and an insulator layer 7 is located on this base electrode 6. The base electrode 6 is electrically insulated from the emitter electrode 9 by spacers 8. An emitter region is formed under the emitter electrode 9 by driving silicon out from the emitter electrode 9 into the base region 2. A collector electrode 10 that is likewise formed of silicon is located on the collector terminal region 4. A lower electrode 25 is located on the oxide layer 5 as surface in the region of the sensor. As an example, the sensor layer 17 again fashioned as a cantilever is attached thereover. A base metallization 11 is located on the base electrode; an emitter metallization 12 is located on the emitter electrode 9; a collector metallization 13 is located on the collector electrode 10. The lower sensor electrode 25 and the sensor layer 17 are each respectively provided with a metallization 14,15. The terminal metallizations 16 are applied on these metallizations 11,12,13,14,15 and are embedded into an dielectric layer 18. This dielectric layer 18 is removed down to the lower sensor electrode 25 in the region of the sensor layer 17 provided as cantilever. so that the cantilever can oscillate in vertical direction. A current-limiting region 29 (channel stopper) doped opposite the collector region 3 is formed in the substrate layer 1.

Figure 2:
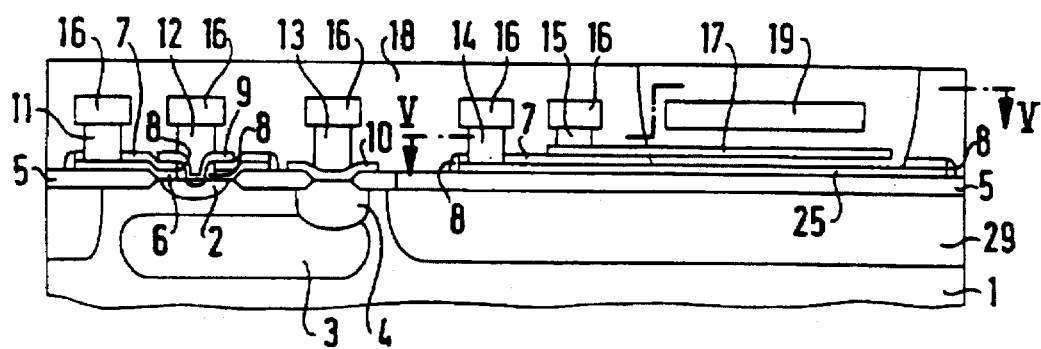
Figure 5:
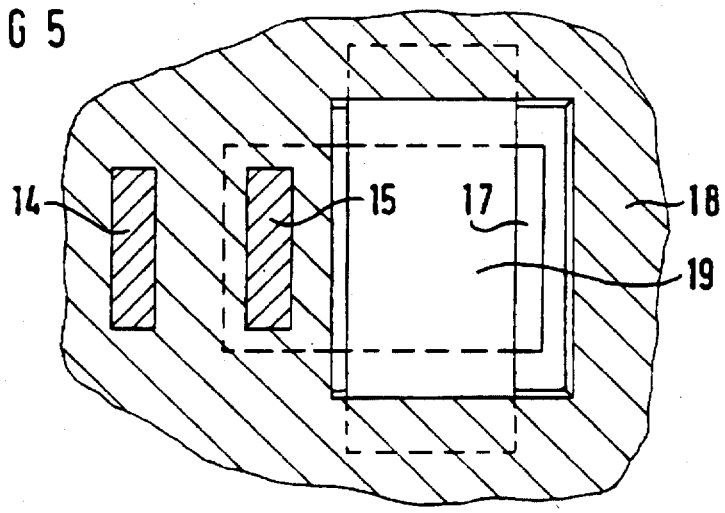
FIG. 5 shows the view indicated in FIG. 2.

FIG. 2 shows an alternative embodiment with upper sensor electrode 19 that is anchored in the dielectric layer 18. The view entered in this FIG. 2 (dot-dash line) is shown in FIG. 5. In section, the metallization 14 of the lower sensor electrode 25 and the metallization 15 of the sensor layer 17 are entered therein. The sensor layer 17 and the upper sensor electrode 19 arranged transversely thereto are shown (broken) with the portions anchored in the dielectric layer 18.

This exemplary embodiment of the inventive method likewise proceeds on the basis of a substrate layer 1 of silicon. The collector region 3 is produced in this substrate layer 1 by implantation and is subsequently overgrown surface-wide by an epitaxial layer 26 of silicon, as shown in cross section in FIG. 6. After the curing of the implantation, the collector region 3 has the approximate boundaries entered in FIG. 6. An implantation for the current-limiting region 29 then potentially ensues, whereby the operational sign of the doping is opposite that of the collector region 3. The base region 3 is likewise produced doped opposite the collector region 3, whereby use is expediently made of a structured oxide layer 5 as mask. This oxide layer 5 can, for example, be produced by structured oxidation of the surface of the substrate layer 1. A polysilicon layer is then applied surface-wide onto this structure shown in FIG. 7 and an insulator is then applied thereon, these being subsequently structured such that, as shown in FIG. 8, one part of the polysilicon layer remains as base electrode 6 and one part thereof remains as lower sensor electrode 25. This lower sensor electrode 25 is located entirely on the oxide layer 5 and is therefore electrically insulated from the silicon of the substrate layer 1. The collector terminal region 4 likewise implanted through an opening of the oxide layer 5 and a region on the base region 2 provided for the emitter terminal remain free (see FIG. 8). In the deposition, the polysilicon layer is doped for the operational sign of the conductivity of the base. By, for example, conformal deposition of an oxide with subsequent anisotropic re-etching, spacers are produced for the insulation of the edges of the base electrode 6.

Figure 10:
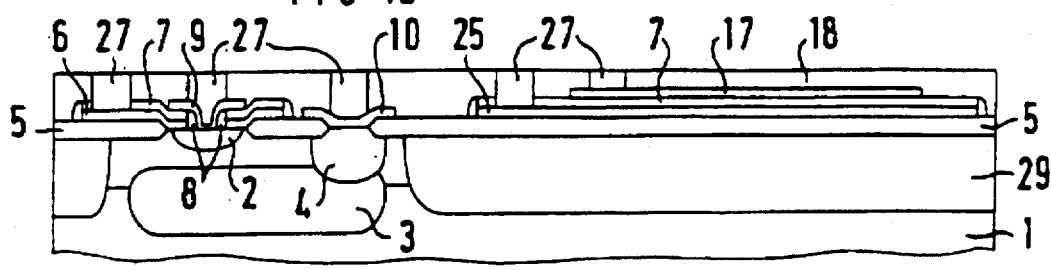
Figure 11:
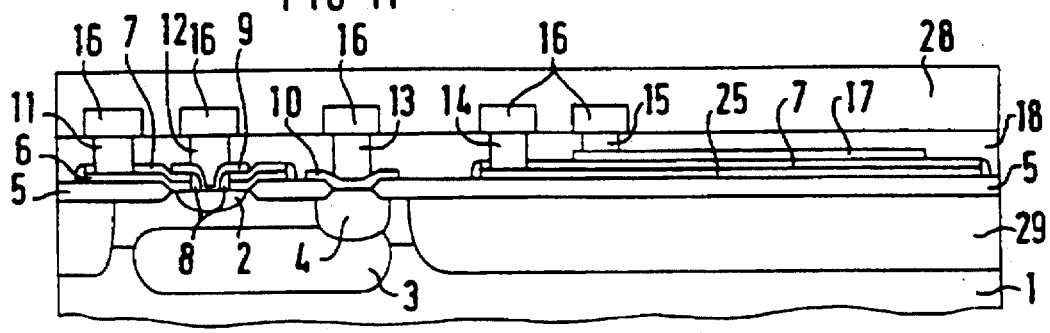
Figure 12:
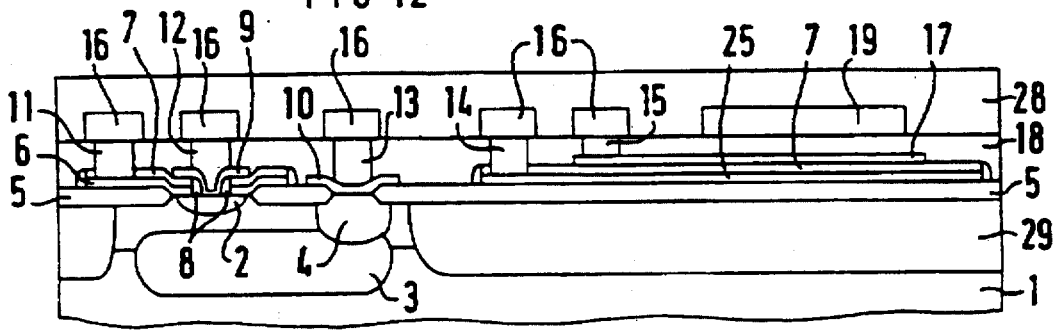
FIG. 12 shows the acceleration sensor after a manufacturing step leading to the structure shown in FIG. 2.

After the deposition of a surface-wide polysilicon layer and subsequent structuring of this polysilicon layer, the emitter electrode 9 between these spacers 8 insulating the base electrode 6, the collector electrode 10 and a sensor layer 17 on the part of the insulator layer 7 insulating the lower sensor electrode remain thereof. It may be seen in FIG. 9 that the lower sensor electrode 25 and this sensor layer 17 are coplanarly arranged vertically above one another with reference to the layer planes and are insulated from one another by the insulator layer 7 situated therebetween. According to FIG. 10, a dielectric layer is then deposited surface-wide in planarizing fashion, and via holes 27 are produced in this dielectric layer 18 at the places provided for electrical terminals. As warranted, these via holes can be filled with a metal filling of, for example, tungsten before the first metallization level is produced. However, the filling of the via holes 27 can also ensue in one step together with the manufacture of this terminal metallization. The base metallization 11, the emitter metallization 12, the collector metallization 13, the metallization 14 for the lower sensor electrode 25 and the metallization 15 for the sensor layer 17 are entered in FIG. 11. The terminal metallization 16 is deposited onto the metallizations and structured and planarized with a passivation layer 28. As warranted, an upper sensor electrode 19 as shown in FIG. 12 can again also be deposited together with the terminal metallization 16. The passivation 28, the dielectric layer 18 and the insulator layer 7 are then removed to the extent in the region of the sensor as required for an adequate mobility of the sensor element formed by the sensor layer 17.

The dielectric layers, for example, are oxide; the passivation layer 28 can, for example, be $SiO_2$ or $Si_3N_4$. The terminal surfaces of the terminal metallization 16 and the sensor layer 17 can either be uncovered in one work step or in two successive phototechnique steps when etchants are employed that do not allow a selective etching of the passivation layer simultaneously relative to the metal of the terminal metallization 16 and relative to the polysilicon of the sensor layer 17. The terminal metallization 16 and, potentially, the upper sensor electrode 19 are, for example, aluminum.

The inventive method is advantageously applied for manufacturing integrated acceleration sensors of the cantilever type. However, micromechanical sensors wherein the sensor layer 17 is, for example, etched completely free can be realized in the same way. For example, integrated sensors wherein the element reacting to the inertial force as a result of an acceleration is a layer-like mass part suspended at silicon springs can also be manufactured with the inventive method in this way. The thickness of the polysilicon layer deposited for this sensor layer 17 and the appertaining transistor electrode must then merely be dimensioned for adequate mechanical stability of this mass part. Corresponding to the described exemplary embodiments, a plurality of transistors or complete electronic circuits that are realized as usual in silicon technology could be integrated with the micromechanical sensor. The polysilicon layer applied for the manufacture of these integrated circuits is respectively simultaneously employed and structured for the manufacture of the sensor element. Even given integration of a plurality of different electronic function elements, a savings in the required process steps thus derives with the inventive method compared to method that were previously known.

The invention is not limited to the particular details of the method depicted and other modifications and applications are contemplated. Certain other changes may be made in the above described method without departing from the true spirit and scope of the invention herein involved. It is intended, therefore, that the subject matter in the above depiction shall be interpreted as illustrative and not in a limiting sense.

What is claimed is:

1. A method for manufacturing an acceleration sensor on silicon, comprising the steps of:

producing, in a first step, a structure of doped regions for a transistor, using a substrate layer of silicon;

depositing, in a second step, a polysilicon layer and structuring the polysilicon layer such that said polysilicon layer forms at least one electrode of said transistor and a sensor layer, and such that said at least one electrode and said sensor layer are separate from one another;

applying in a third step, metallizations as electrical terminals for said transistor, for said sensor layer and for at least one further sensor electrode; and uncovering in a fourth step, said sensor layer an extent that the sensor layer is at least partially movable in at least one direction.

2. The method according to claim 1, wherein the transistor is manufactured as a CMOS transistor, and the polysilicon layer forms a gate electrode and the sensor layer.

3. The method according to claim 2, wherein in the first step, a doped region provided for the transistor is produced in the substrate layer and a structured oxide layer is produced on a surface of the substrate layer, and wherein source and drain regions and a gate oxide are produced in openings of said oxide layer thereafter;

in the second step, the sensor layer is produced on a portion of said oxide layer;

in the third step, a dielectric layer, producing via holes therein, and introducing source and drain metallizations and metallizations for the sensor layer and for a further sensor electrode into said via holes; and in the fourth step, said dielectric layer and said oxide layer are removed to an extent required for predetermined mobility of the sensor layer.

4. The method according to claim 1, wherein the transistor is manufactured as a bipolar transistor, wherein a further polysilicon layer is deposited and structured between the first step and the second step said further polysilicon layer forming a base electrode and a lower sensor electrode, and wherein an insulator layer and spacers are applied thereafter; and wherein the polysilicon layer applied in the second step forms an emitter electrode, a collector electrode and the sensor layer.

5. The method according to claim 4, wherein in the first step, an implantation is undertaken for manufacture of a collector region and a doped epitaxial layer is applied;

wherein a structured oxide layer is then produced;

wherein a base region doped opposite said epitaxial layer and a collector terminal region are produced through openings of said oxide layer;

wherein the further polysilicon layer and an insulator layer thereon are applied and structured, so that the lower sensor electrode is arranged on said oxide layer;

wherein free edges of a base electrode are then insulated by spacers; and the second step is then implemented.

6. The method according to claim 1, wherein the sensor layer is manufactured as a self-supporting polysilicon strip in the fourth step.

7. The method according to claim 1, wherein the sensor layer is manufactured as a mass part suspended at springs in the fourth step.

8. The method according to claim 1, wherein the further sensor electrode and the sensor layer are coplanarly arranged and are arranged vertically above one another with reference to layer planes.

9. The method according to claim 1, wherein following the third step, a planar, upper sensor electrode is produced coplanarly and vertically above the sensor layer with reference to layer planes.

* * * * *